(12) United States Patent
Kamogi

(10) Patent No.: US 8,704,417 B2
(45) Date of Patent: Apr. 22, 2014

(54) MOTOR CONTROL UNIT AND BRUSHLESS MOTOR

(75) Inventor: Yutaka Kamogi, Shizuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/821,872

(22) PCT Filed: Jul. 23, 2012

(86) PCT No.: PCT/JP2012/004661
§ 371 (c)(1),
(2), (4) Date: Mar. 8, 2013

(87) PCT Pub. No.: WO2013/094086
PCT Pub. Date: Jun. 27, 2013

(65) Prior Publication Data
US 2014/0028161 A1      Jan. 30, 2014

(30) Foreign Application Priority Data

Dec. 22, 2011    (JP) ................................. 2011-280916

(51) Int. Cl.
*H02K 11/00*       (2006.01)
(52) U.S. Cl.
USPC .......................................... 310/71; 310/68 D
(58) Field of Classification Search
USPC ................................. 310/68 D, 71
See application file for complete search history.

(56) References Cited

U.S. PATENT DOCUMENTS

| | | | |
|---|---|---|---|
| 5,093,593 A | | 3/1992 | Philipp |
| 5,528,093 A * | | 6/1996 | Adam et al. ................. 310/89 |
| 5,777,410 A * | | 7/1998 | Asakura et al. ............. 310/71 |
| 6,201,326 B1 * | | 3/2001 | Klappenbach et al. ..... 310/75 R |
| 7,602,090 B2 * | | 10/2009 | Huck et al. ................. 310/71 |
| 7,728,472 B2 * | | 6/2010 | Huck et al. ................. 310/71 |
| 2004/0021379 A1 * | | 2/2004 | Breynaert et al. .......... 310/68 B |
| 2005/0040715 A1 * | | 2/2005 | Nesic .......................... 310/71 |
| 2005/0206254 A1 | | 9/2005 | Tsuge et al. |
| 2006/0113860 A1 * | | 6/2006 | Breynaert et al. .......... 310/239 |
| 2007/0001528 A1 * | | 1/2007 | Umegaki et al. ........... 310/88 |
| 2007/0018517 A1 * | | 1/2007 | Huck et al. ................. 310/71 |
| 2008/0158830 A1 | | 7/2008 | Tominaga et al. |
| 2009/0195094 A1 * | | 8/2009 | Oda et al. ................... 310/71 |
| 2010/0117468 A1 * | | 5/2010 | Kurita ......................... 310/71 |
| 2011/0193452 A1 | | 8/2011 | Yakushiji |
| 2011/0291500 A1 | | 12/2011 | Tang et al. |
| 2011/0291502 A1 | | 12/2011 | Tang et al. |
| 2011/0298321 A1 | | 12/2011 | Tang et al. |

FOREIGN PATENT DOCUMENTS

| | | |
|---|---|---|
| CN | 201422057 Y | 3/2010 |
| EP | 1 001 509 B1 | 5/2004 |

(Continued)

OTHER PUBLICATIONS

Office Action in corresponding Chinese Application No. 201280003176.1, and partial translation thereof, dated Dec. 2, 2013, 10 pages.

*Primary Examiner* — Thanh Lam
(74) *Attorney, Agent, or Firm* — Brinks Gilson & Lione

(57) ABSTRACT

A motor control unit includes two circuit boards accommodated in a board housing, and a connection holder placed on an outer face of the board housing. The connection holder includes external connection terminals and connection pins. Each one of the circuit boards is provided with multiple through-holes for receiving the connection pins, each of which is formed of an external connection pin and an internal connection pin. The connection holder and the circuit boards are placed such that the connection pins penetrate the through-holes of the circuit boards respectively.

14 Claims, 5 Drawing Sheets

(56) References Cited

FOREIGN PATENT DOCUMENTS

| JP | 2005-102370 A | 4/2005 |
| JP | 2005-269875 A | 9/2005 |
| JP | 2005-304203 A | 10/2005 |
| JP | 2008-166382 A | 7/2008 |
| JP | 2011-004584 A | 1/2011 |
| JP | 2011-163232 A | 8/2011 |

* cited by examiner

MOTOR CONTROL UNIT AND BRUSHLESS MOTOR

This application is a 371 application of PCT/JP2012/004661 having an international filing date of Jul. 23, 2012, which claims priority to JP2011-280916 filed Dec. 22, 2011, the entire contents of which are incorporated herein by reference.

TECHNICAL FIELD

The present invention relates to a motor control unit accommodating a circuit board that drives and controls a motor, and it also relates to a brushless motor that incorporates the same motor control unit.

BACKGROUND ART

Techniques about the motor control unit and the brushless motor to be mounted in a car as car-electric components have been proposed. For instance, Patent Literatures 1-3 disclose motor control units to be used for driving and controlling a motor in an electric power steering, or a motor in a valve-timing changing unit.

The motor control unit disclosed in Patent Literature 1 accommodates multiple circuit boards classified into, e.g. a power board and a control board, in the unit. The power board is formed of metal board to which heavy-current semiconductors are mounted. The control board includes a microprocessor thereon and handles small signals. The power board includes a connection member thereon which has connection terminals. The control board has through-holes for a connection with the power board. The connection terminals of the power board are inserted into these through-holes so that signals can travel between the power board and the control board. Patent Literature 1 thus discloses the foregoing connection terminals as an internal connection means that connects electrically the power board to the control board.

Patent Literature 2 discloses the motor control unit that accommodates a heavy-current semiconductor and a circuit board therein, and employs a conductive plate connected to a terminal of the heavy-current semiconductor for a connection with the circuit board. The heavy-current semiconductor is mounted directly to a heat sink, which is a part of a housing, and includes conductive plates connected to its terminals necessitating the plates. Each one of the conductive plates includes a terminal extending from the board edge. The circuit board includes through-holes corresponding to the respective terminals. An insertion of the terminal into the through-hole of the circuit board allows signals to travel between the heavy-current semiconductor and the circuit board. Patent Literature 2 thus discloses the conductive plate including the terminals as an internal connection means that connects electrically the heavy-current semiconductor to the circuit board. The terminals can be also used as an external connection means for a connection with an external device, e.g. a power supply.

Patent Literature 3 discloses the brushless motor that accommodates a feeder plate and a circuit board in a unit that is incorporated into the brushless motor. The housing of this brushless motor includes multiple connection terminals, and lead-wires extend from the connection terminals into the housing for power feeding. Patent Literature 3 thus discloses the connection terminals as external connection means for a connection with an external device, e.g. a power supply.

However, the conventional internal connection means or the external connection means discussed above is configured proper to the placements of the components and the boards of a particular model, so that the configuration allows a modification, e.g. downsizing, for this particular model only. The configuration is thus lack of multiplicity of use for a variety of models.

Patent Literature 1: Unexamined Japanese Patent Application Publication No. 2005-304203
Patent Literature 2: Unexamined Japanese Patent Application Publication No. 2008-166382
Patent Literature 3: Unexamined Japanese Patent Application Publication No. 2005-269875

DISCLOSURE OF THE INVENTION

A motor control unit of the present invention includes at least two circuit boards in a housing for driving and controlling the motor, and has a connection holder on an outer face of the housing for an electrical connection with an external device. The connection holder includes an external connection terminal to be connected to the external device as well as multiple connection pins extending in the same direction with each other. The two circuit boards have multiple through-holes, and the connection pins penetrate the through-holes. Each of the multiple connection pins is formed of an external connection pin connected electrically to an external connection terminal and an internal connection pin insulated from the external connection terminal. The connection holder and the two circuit boards are placed such that the multiple connection pins can penetrate the through-holes of both of the two circuit boards.

The foregoing structure allows the connection holder, which is used for a connection with an external device, to electrically connect the two circuit boards to each other within the housing of the boards.

A brushless motor of the present invention incorporates a stator wound with windings, a rotor confronting the stator and disposed rotatably, and the motor control unit of the present invention.

As discussed above, the motor control unit of the present invention and the brushless motor incorporating the motor control unit use the connection holder for a connection between the circuit boards together in the housing of the boards. This structure thus allows saving a preparation of connection member for the connection between circuit boards model by model for respective models, and also standardizing the connection between the circuit boards or between the connection holders in the motor control units. As a result, the multiplicity of use of the motor control unit can be increased. The standardization of the connection holder among various models can be achieved, so that a new design of connector is not needed, or reliability verification of a new component is not required. The man-hour and time to be needed for those actions can be thus saved.

DETAILED DESCRIPTION OF THE PREFERRED EMBODIMENT

A brushless motor including a motor control unit in accordance with an embodiment of the present invention is demonstrated hereinafter with reference to the accompanying drawings.

Exemplary Embodiment

Figure 1:
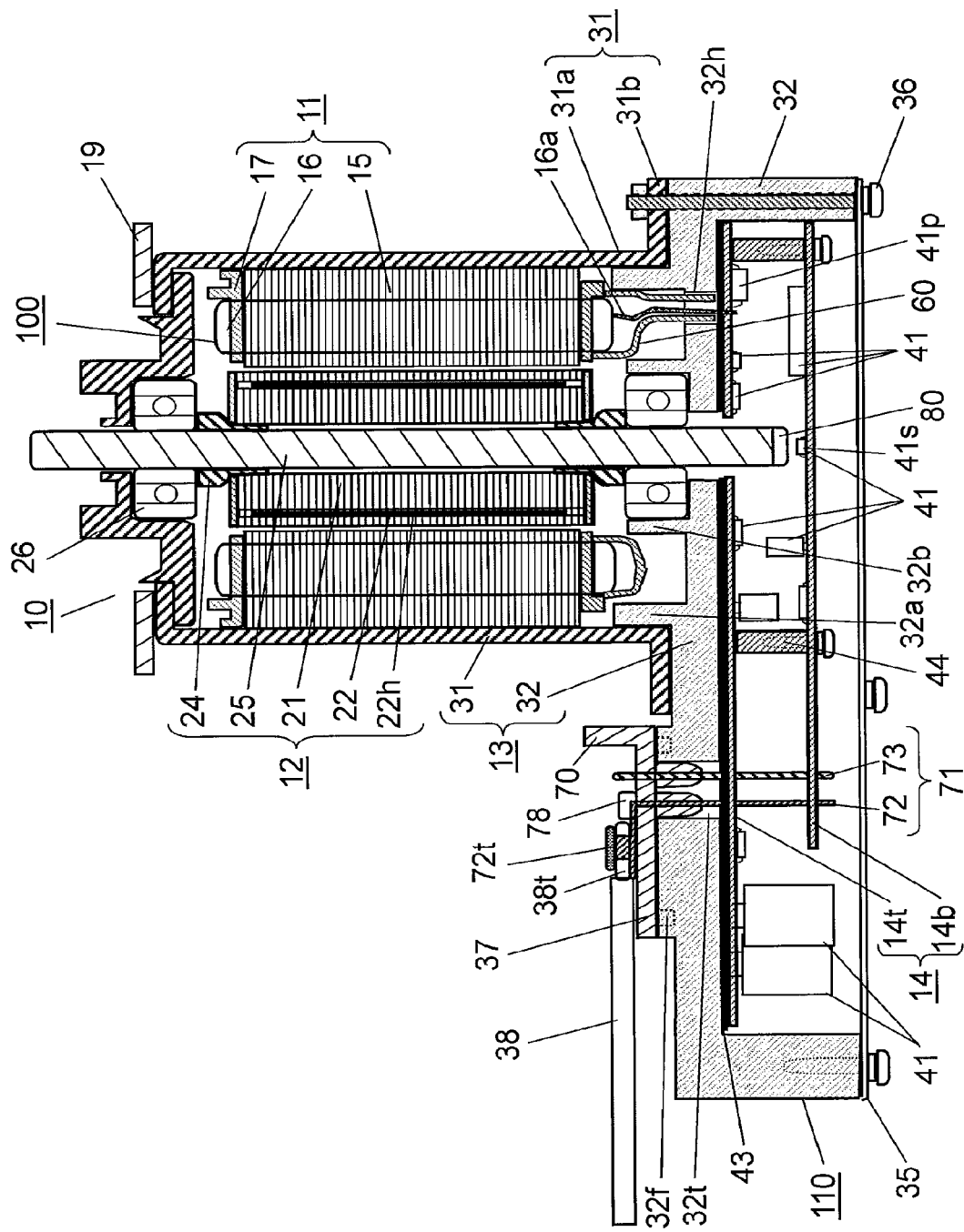
FIG. 1 is a sectional view illustrating a structure of a brushless motor including a motor control unit in accordance with an embodiment of the present invention.
Figure 2:
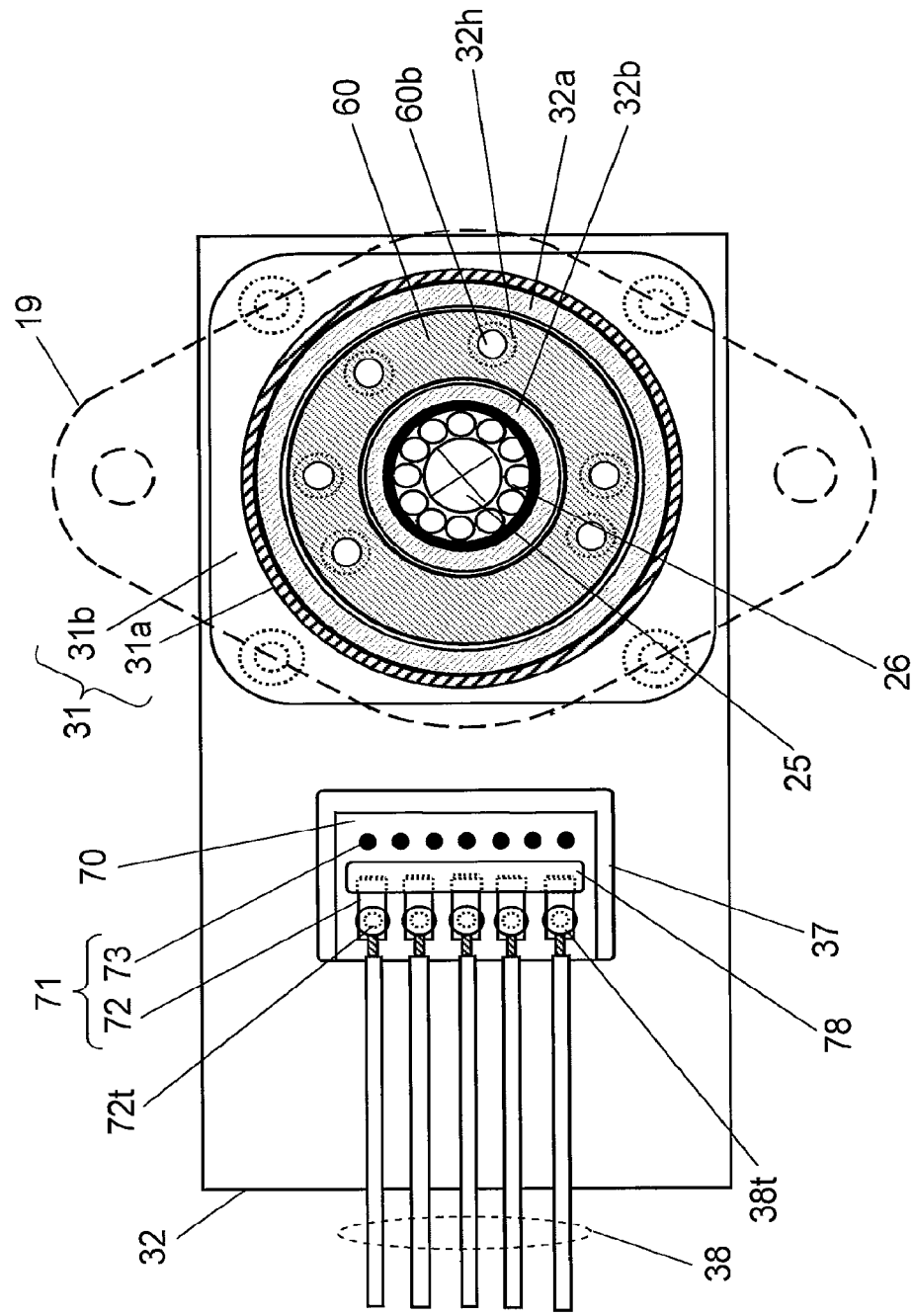
FIG. 2 is a plan view illustrating essential parts of the brushless motor shown in FIG. 1.

FIG. 1 is a sectional view illustrating a structure of brushless motor 10 including a motor control unit in accordance with the embodiment of the present invention. FIG. 2 is a plan view illustrating essential parts of brushless motor 10 shown in FIG. 1. In this embodiment, an inner-rotor type brushless motor, i.e. the rotor is rotatably placed inside the stator, is taken as an example.

First, an entire structure of brushless motor 10 is described with reference to FIG. 1 and FIG. 2. As shown in FIG. 1, brushless motor 10 includes stator 11 and rotor 12 in housing 13, and also includes circuit board 14 for driving and controlling motor 10. Housing 13 is formed of metallic motor housing 31 for accommodating stator 11 and rotor 12 and metallic board housing 32 for accommodating circuit board 14.

Stator 11, rotor 12, and other necessary members are mounted to motor housing 31, whereby motor unit 100 is constructed. Board housing 32 accommodates circuit board 14 and other necessary members, and then lid 35 is mounted to board housing 32, whereby motor control unit 110 in accordance with the embodiment is constructed. Motor control unit 110 drives and controls motor 10. Brushless motor 10 in accordance with this embodiment is formed by incorporating motor unit 100 and motor control unit 110 together.

Motor housing 31 is formed of casing 31a shaped like a cup having a cylindrical upper section and an opening at a bottom, and flat plate 31b extending outward from the opening at the bottom. Stator 11 and rotor 12 are housed in motor housing 31 as shown in FIG. 1.

On a top face of motor housing 31, metal mounting section 19 is formed and integrated with motor housing 31 for mounting brushless motor 10 to a target member. This structure allows the heat generated in stator 11 to travel to the target member via mounting section 19 for dissipating.

Board housing 32 is placed on the underside of motor housing 31. Board housing 32 shapes like a box and has an opening at the bottom. Circuit board 14 is accommodated inside this board housing 32, which is mountable or detachable to/from motor housing 31. Annular rise 32a is formed on the top face of board housing 32 in order to mount board housing 32 to motor housing 31. Annular rise 32a protrudes in an annular shape, as shown in FIG. 2, from the top face of board housing 32 toward motor housing 31. Annular rise 32a is inserted into the opening of motor housing 31, thereby joining board housing 32 and motor housing 31 together. The mounting of board housing 32 to motor housing 31 allows motor housing 31 to be generally sealed. On top of that, lid 35 is mounted onto the bottom of board housing 32, thereby generally sealing board housing 32. In this embodiment, screws 36 are used for rigidly mounting board housing 32 to motor housing 31, so that the motor and the drive-control circuit are integrated together, whereby brushless motor 10 is constructed.

In motor unit 100, stator 11 is formed of stator core 15 and windings 16 wound on stator core 15 via insulator 17 in each phase. In this embodiment, windings 16 are separated into three phases at 120° intervals from each other, namely, phase U, phase V, and phase W. Windings 16 are wound on stator core 15, which is formed by layering multiple steel sheets and includes multiple salient poles protruding inward. Windings 16 are wound on these salient poles via insulators 17 made of resin, and insulators 17 insulate stator core 15, of which outer circumference shapes like a cylinder, and the outer wall of this cylindrical shape is brought into face-contact with and is fixed to the inside of casing 31a. In other words, an outer diameter of stator core 15 is approx. equal to an inner diameter of casing 31a. Rotor 12 is inserted inside this stator 11 via a space.

Rotor 12 is formed of rotor core 21 holding permanent magnet 22, rotary shaft 25 extending through the inside of rotor core 21, and fixing member 24 for fixing rotor core 21 to rotary shaft 25. This embodiment employs rotor 12 of an IPM (Interior Permanent Magnet) type. To be more specific, rotor core 21 has multiple slots 22h in parallel with rotary shaft 25 to receive permanent magnets 22, which are inserted into slots 22h respectively. Rotor core 21 is formed by layering multiple steel sheets and shapes like a cylinder, and rotary shaft 25 is placed at the center thereof. The outer wall of rotor core 21 confronts the tip faces of the respective salient poles of stator core 15.

Rotary shaft 25 penetrates inside the rotor core 21 and extends to both the sides, at which bearings 26 support shaft 25 rotatably. First bearing 26 is fixed to the top face of motor housing 31 at an outer face thereof, and second bearing 26 is fixed to the top face of board housing 32 at an outer face thereof. Annular rise 32b is formed on the top face of board housing 32, and annular rise 32b protrudes to motor housing 31 for holding second bearing 26, which is fixed to the inside of annular rise 32b.

Rotary shaft 25 further extends from the top face of motor housing 31, to which first bearing 26 is fixed, to the outside of motor housing 31, and is used as an output shaft for driving and rotating the motor. Rotary shaft 25 extends to the other side, i.e. to second bearing 26, penetrates the top face of board housing 32 and extends inside the board housing 32. Position sensing magnet 80 is mounted to the tip of rotary shaft 25 extending inside the board housing 32.

In motor control unit 110, various circuit components 41 are mounted on circuit board 14, which is built in board housing 32. Circuit components 41 forms a power supply circuit and a drive-control circuit for controlling and driving the motor. For instance, position sensor 41s is mounted on circuit board 14 such that position sensor 41s confronts position sensing magnet 80 attached to the tip of rotary shaft 25. This structure allows sensing a position in the rotary operation.

Motor control unit 110 also has connection holder 37 on an outer surface of board housing 32. To be more specific, as shown in FIG. 2, connection holder 37 is placed on the top face of board housing 32, and external wirings 38, e.g. a power line and a control signal line, are connected to external connection terminals 72t of connection holder 37. The electric power, for instance, is supplied via connection holder 37 to the power supply circuit disposed in board housing 32.

This embodiment employs circuit board 14 formed of multiple circuit boards accommodated in board housing 32, and one of the circuit boards includes an inverter circuit. To be more specific, circuit board 14 is separated into two boards, namely, first circuit board 14t that includes circuit components 41 generating greater amounts of heat, and second circuit board 14b that includes circuit components 41 generating smaller amounts of heat. Circuit board 14 is electrically connected to an external device via connection pin 71 of connection holder 37, and this connection pin 71 is also used for transmitting signals between first circuit board 14*t* and second circuit board 14*b*.

First circuit board 14*t* includes circuit components 41 generating greater amounts of heat, e.g. power element 41*p* such as an inverter transistor. In other words, first circuit board 14*t* chiefly forms the drive circuit including the inverter for energizing and driving the windings 16. The inverter transistor, among others, allows a heavy current to run through, so that it generates a large amount of heat. The inverter transistor is formed of semiconductor element, so that its operating temperature greater than a rated value will cause a breakdown. The protection against heat is thus critical. First circuit board 14*t* is placed to thermally couple with board housing 32 in order to dissipate the heat. To be more specific, first circuit board 14*t* is made contacts to the top face of board housing 32 with insulating sheet 43 therebetween as an electric insulation layer. Insulating sheet 43 is made of electrically insulating and good heat-conductive material. This structure allows the heat generated by first circuit board 14*t* to dissipate efficiently from board housing 32 while the electric insulation between board housing 32 and first circuit board 14*t* is maintained.

Second circuit board 14*b*, on the other hand, includes circuit components 41, e.g. a microprocessor for control, which allows light currents to run through and generate smaller amounts of heat. In other words, second circuit board 14*b* chiefly forms a control circuit that controls the inverter or the speed, based on a position sensing supplied from position sensor 41*s*, in order to drive the motor. Second circuit board 14*b* is placed closer to the opening than first circuit board 14*t* in board housing 32. This embodiment employs spacers 44 extending from the top face toward the opening to hold second circuit board 14*b* within board housing 32.

Inverter power element 41*p* mounted on first circuit board 14*t* energizes and drives the windings 16, so that this embodiment employs the following structure: Windings 16 of phases U, V, and W have respective ends as leaders 16*a* that are led from stator 11 toward board housing 32, of which top face is provided with multiple holes 32*h*. Respective leaders 16*a* run through holes 32*h* and are connected to first circuit board 14*t*. To be more specific, heat insulator 60 of lower heat conductivity is disposed between windings 16 and board housing 32. Heat insulator 60 includes cylindrical guide section 60*b*, which is inserted into hole 32*h* of board housing 32. Leaders 16*a* run through guide section 60*b* and reach first circuit board 14*t*. In other words, heat insulator 60 cuts off the heat supplied from motor housing 31 and insulates leaders 16*a* from board housing 32.

As discussed above, motor control unit 110 accommodates at least two circuit boards 14 in board housing 32, and places connection holder 37 on the outer face of board housing 32 for an electrical connection with an external device.

Figure 3:
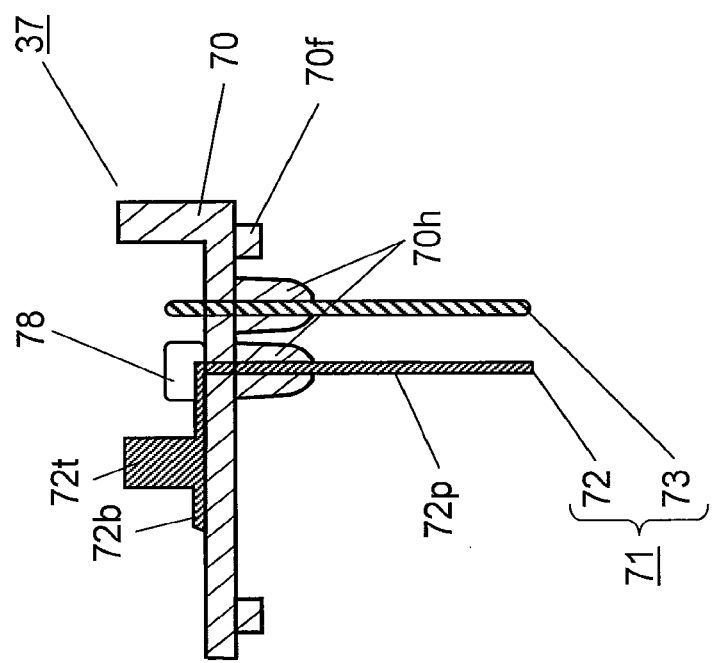
FIG. 3 is a sectional view of a connection holder of the brushless motor shown in FIG. 1.
Figure 4:
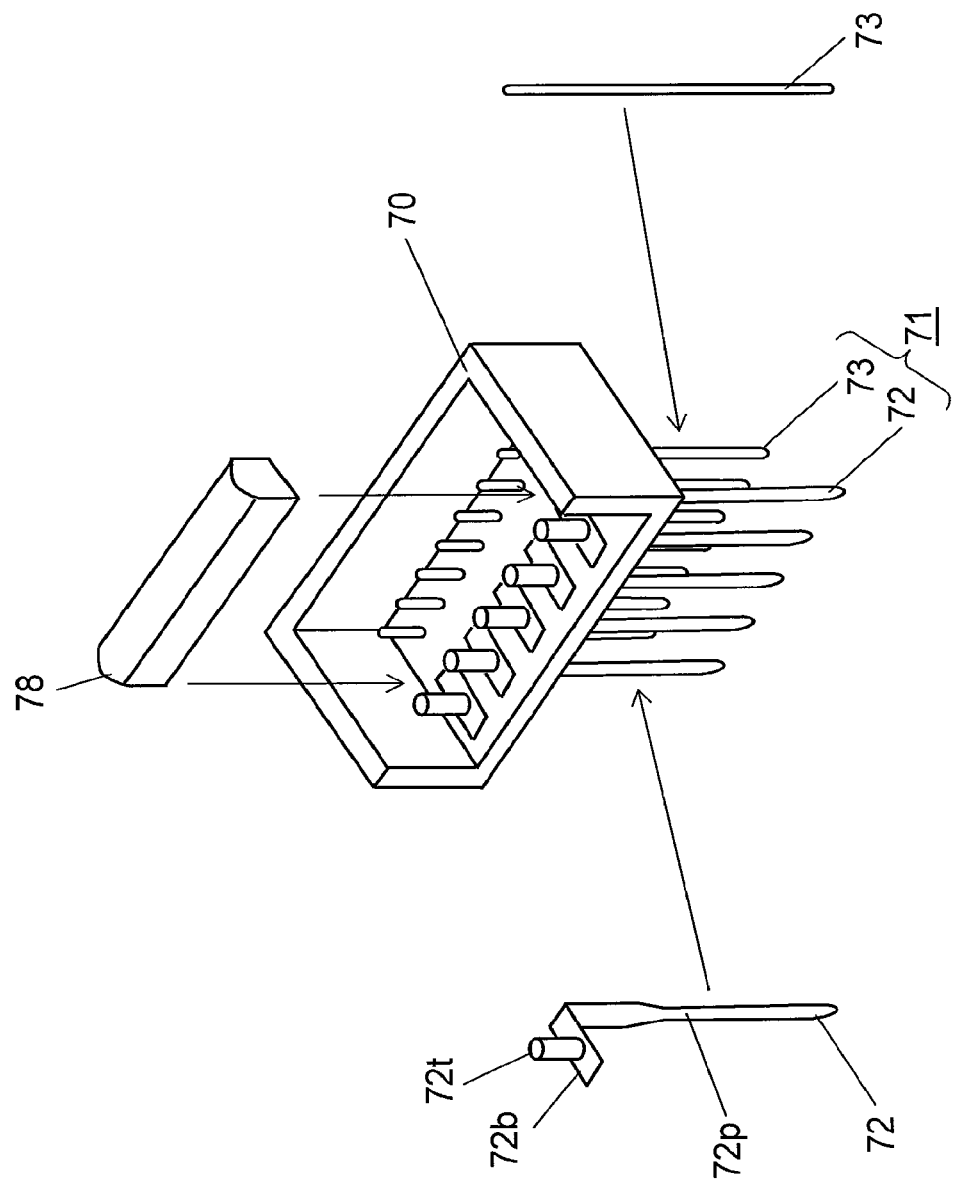
FIG. 4 is an exploded view illustrating a structure of the connection holder of the brushless motor.

Connection holder 37 employed in this embodiment is detailed hereinafter. FIG. 3 is a sectional view of connection holder 37 of the brushless motor including the motor control unit in accordance with the embodiment. FIG. 4 is an exploded view of connection holder 37.

As FIG. 3 shows, connection holder 37 includes holder housing 70 made of resin and multiple pins 71 extending in the same direction with each other. Holder housing 70 includes pin holder 70*h* through which respective connection pins 71 are led out. Each pin 71 projects and extends like a needle from pin holder 70*h*. Connection pins 71 are formed of multiple external connection pins 72 to be electrically connected to external connection terminals 72*t* and multiple internal connection pins 73 insulated from external connection terminals 72*t*. External connection pins 72 are electrically connected to external wiring 38, e.g. power line or control signal line. FIG. 1 shows an instance where connection terminal 38*t* is disposed in connection with external connection terminal 72*t* shown in FIG. 3 of external wiring 38. A top of connection terminal 72*t* is riveted to connect connection terminal 38*t* to external connection terminal 72*t*.

To be more specific, connection holder 37 shown in FIG. 4 is demonstrated hereinafter. Internal connection pin 73 simply extends in one direction as shown in FIG. 4, and it is formed of long cylindrical bar having tapered tips on both the ends. External connection pin 72, on the other hand, integrates connection pin 72*p* extending along pin 73 with external connection terminal 72*t*. As FIG. 4 shows, external connection pin 72 includes bent section 72*b* at a place closer to holder housing 70 of connection pin 72*p*, and bent section 72*b* is bent at approx. a right angle relative to connection pin 72*p*. On this bent section 72*b*, cylindrical external connection terminal 72*t* is formed. This embodiment employs a long and flat metal plate because of easy-to-process, and the long and flat metal plate is bent into L-shape for working as external connection pin 72.

The foregoing external and internal connection pins 72 and 73 are press-fitted into small holes formed in advance on holder housing 70, whereby each one of connection pins 71 is mounted to holder housing 70. Pin fixing member 78 made of resin seals up bent section 72*b* in order to positively fixing external connection pins 72 to holder housing 70.

As discussed above, connection holder 37 has a simple structure, so that it can be manufactured with an inexpensive metal die and components and through a simple procedure. Every connection pin 71 is sealed up with resin in holder housing 70, whereby the motor control unit can be used in a waterproof electronic control unit.

Since this embodiment employs the L-shaped external connection pins 72, which can be press-fitted into holder housing 70 with ease by using bent sections 72*b*. To be more specific, bent section 72*b* is used as a push face so that external connection pin 72 can be pressed into the small hole of holder housing 70. Here is another method: External wiring 38 is crimped to external connection terminal 72*t* in advance, and this pin 72 is press-fitted into holder housing 70 with more ease. On top of that, external wiring 38 extends at approx. a right angle relative to the extending direction of connection pin 72*p*, so that external connection pin 72 can be retained in housing 70 strong enough against failures such as come-out of pin 72*p* from housing 70 due to a pull of wiring 38.

To mount the foregoing connection holder 37 to board housing 32, of which top face is provided with holes to receive holder 37. To be more specific, board housing 32 has holder fixing hole 32*f* and holder hole 32*t* as shown in FIG. 1. Holder fixing hole 32*f* is used for fixing the connection holder 37 to housing 32, and holder hole 32*t* is used for also fixing the holder 37 to housing 32 and guiding the connection pins 71 inside the housing 32. On the other hand, connection holder 37 is provided with holder fixing protrusion 70*f* shown in FIG. 3 and corresponding to holder fixing hole 32*f*. Protrusion 70*f* is mated with hole 32*f*, and pin holder 70*h* is inserted into holder hole 32*t*, so that connection holder 37 is mounted to board housing 32. As a result, connection pin 71 extends into board housing 32.

Figure 5:
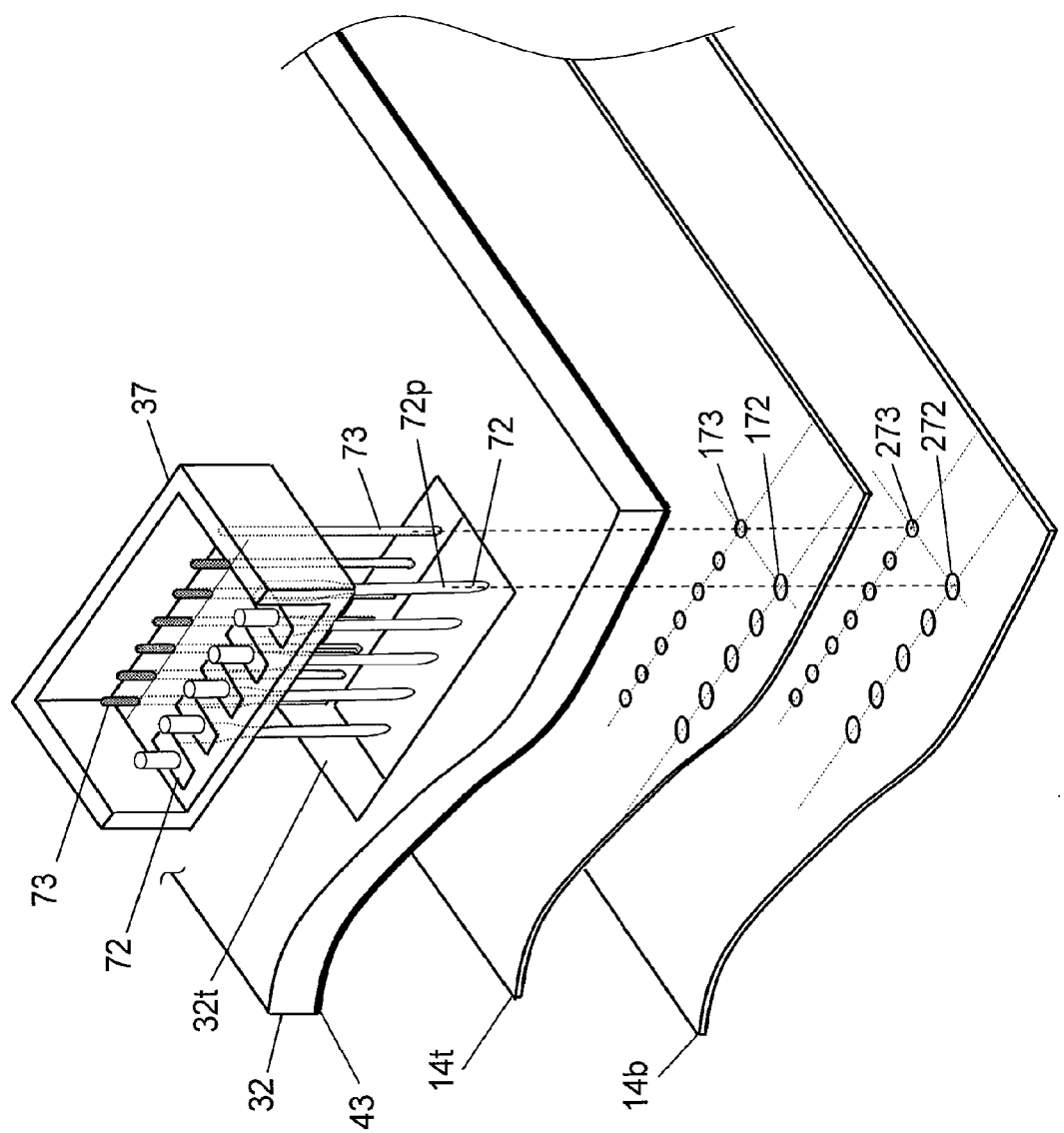
FIG. 5 shows a placement of the connection holder and a circuit board of the brushless motor.

Next, the placement of connection holder 37 and circuit board 14 is demonstrated hereinafter. FIG. 5 shows a positional relation between connection holder 37 and circuit board 14 of the brushless motor including the motor control unit in accordance with this embodiment.

As FIG. 5 shows, first circuit board 14*t* is provided with through-holes 172 for receiving connection pins 72*p* of external connection pins 72 and through-holes 173 for receiving internal connection pins 73. Second circuit board 14*b* is provided with through-holes 272 for receiving connection pins 72*p* and through-holes 273 for receiving internal connection pins 73. Circuit board 14 is thus provided with the foregoing multiple through-holes for receiving connection pins 71.

First circuit board 14*t* is provided with lands for wiring patterns around through-holes 172. The wiring patterns are used for electrical connections with external wirings 38. In a similar way, second circuit board 14*b* is provided with lands for wiring patterns around through holes 272. These wiring patterns are used for electrical connections with external wirings 38.

Through-holes 173 of first circuit board 14*t* are provided with lands for wiring patterns to be used for connections with second circuit board 14*b*, and through-holes 273 of second circuit board 14*b* are provided with lands for wiring patterns to be used for connections with first circuit board 14*t*.

First circuit board 14*t* is put into board housing 32 with connection holder 37 mounted to housing 32 such that connection pins 72*p* penetrate through-holes 172 and internal connection pins 73 penetrate through-holes 173. While connection pins 72*p* are kept penetrating through-holes 172, the land is, e.g. soldered, thereby electrically connecting external wiring 38 to a desirable circuit on first circuit board 14*t*. While internal connection pins 73 are kept penetrating through-holes 173, the land is, e.g. soldered. Next, second circuit board 14*b* is put into board housing 32 such that connection pins 72*p* penetrate through-holes 272 and internal connection pins 73 penetrate through-holes 273. While connection pins 72*p* are kept penetrating through-holes 272, the land is, e.g. soldered, thereby electrically connecting external wiring 38 to a desirable circuit on second circuit board 14*b*. While internal connection pins 73 are kept penetrating through-holes 273, the land is, e.g. soldered, whereby the circuit on first circuit board 14*t* is electrically connected, via internal connection pins 73, to the circuit on second circuit board 14*b*.

As discussed above, this embodiment places connection holder 37 and respective circuit boards 14 such that external connection pins 72 and internal connection pins 73 can penetrate the through-holes of respective circuit boards 14.

The foregoing structure allows connection holder 37 of small size and simple shape to achieve an electrical connection between respective circuit boards 14. Although connection holder 37 is originally used for an electrical connection with an external device, it can be used for an electrical connection between respective circuit boards 14 accommodated in board housing 32. This structure thus can save preparation of a connection member between respective circuit boards model by model. The connection between circuit boards or connectors in the motor control unit can be thus standardized, and the multiplicity use of the motor control unit is increased. To be more specific, at least one of the two circuit boards 14 is electrically connected to external connection terminals 72*t* via external connection pins 72, and the connection between respective circuit boards 14 corresponds model by model to the motor control unit, and the two circuit boards 14 can be electrically connected together via internal connection pins 73.

The motor control unit of the present invention accommodates at least two circuit boards, which drive and control the motor, in the housing, and includes the connection holder on the outer face of the housing for an electrical connection with an external device. The connection holder includes external connection terminals for an electric connection with the external device and multiple connection pins extending in the same direction with each other. The two circuit boards are provided with multiple through-holes for receiving the connection pins. The multiple connection pins are formed of external connection pins connecting electrically to external connection terminals and internal connection pins electrically insulated from the external connection terminals. The connection holder and the two circuit boards are placed such that the multiple connection pins penetrate the through-holes of the two circuit boards respectively. The brushless motor of the present invention incorporates a stator wound with windings, a rotor disposed rotatably and confronting the stator, and the foregoing motor control unit together.

The foregoing structure allows standardizing the connections between circuit boards or connectors, whereby the multiplicity use of the motor control unit can be increased. As a result, the motor control units can be used in different models.

This embodiment refers to the IPM type rotor; however, the present invention is applicable to an SPM (Surface Permanent Magnet) type rotor, of which magnets are placed on the surface thereof.

INDUSTRIAL APPLICABILITY

The present invention provides a motor control unit that can be used in different models, so that the present invention is useful for motor control units of car-electric components or other electric devices, and brushless motors to be equipped with the motor control units.

The invention claimed is:

1. A motor control unit comprising:
   at least two circuit boards for driving and controlling a motor;
   a housing for accommodating the at least two circuit boards; and
   a connection holder disposed on an outer face of the housing for electric connection with an external device,
   wherein the connection holder includes an external connection terminal for the electric connection with the external device and a plurality of connection pins extending in the same direction with each other,
   wherein the two circuit boards are provided respectively with a plurality of through-holes for receiving the connection pins,
   wherein each of the plurality of connection pins is formed of an external connection pin connected electrically to the external connection terminal and an internal connection pin insulated from the external connection terminal, and
   wherein the connection holder and the two circuit boards are placed such that the plurality of connection pins penetrate the through-holes of both of the two circuit boards.

2. The motor control unit of claim 1, wherein at least one of the two circuit boards is electrically connected to the external connection terminal via the external connection pin, and the two circuit boards are electrically connected together via the internal connection pin.

3. The motor control unit of claim 1, wherein one of the two circuit boards is provided with at least an inverter power element for driving a winding of the motor.

4. The motor control unit of claim 3, wherein the connection holder, the one of the circuit boards, and another one of the circuit boards are disposed in this order in an extending direction of the connection pins from the connection holder.

5. The motor control unit of claim 4, wherein the one of the circuit boards is disposed on an inner face of the housing such that the one of the circuit boards is thermally coupled with the housing via an electric insulation layer.

6. The motor control unit of claim 1, wherein the external connection pin incorporates a connection pin extending along the internal connection pin, a bent section bent on the connection pin at approx. a right angle relative to the connection pin, and the external connection terminal formed at the bent section,
wherein the connection pin, the bent section, and the external connection terminal are incorporated together.

7. The motor control unit of claim 2, wherein the external connection pin incorporates a connection pin extending along the internal connection pin, a bent section bent on the connection pin at approx. a right angle relative to the connection pin, and the external connection terminal formed at the bent section,
wherein the connection pin, the bent section, and the external connection terminal are incorporated together.

8. A brushless motor comprising:
a stator provided with a winding;
a rotor disposed rotatably and confronting the stator; and
the motor control unit of claim 1,
wherein the stator, the rotor, and the motor control unit are incorporated together.

9. A brushless motor comprising:
a stator provided with a winding;
a rotor disposed rotatably and confronting the stator; and
the motor control unit of claim 2,
wherein the stator, the rotor, and the motor control unit are incorporated together.

10. A brushless motor comprising:
a stator provided with a winding;
a rotor disposed rotatably and confronting the stator; and
the motor control unit of claim 3,
wherein the stator, the rotor, and the motor control unit are incorporated together.

11. A brushless motor comprising:
a stator provided with a winding;
a rotor disposed rotatably and confronting the stator; and
the motor control unit of claim 4,
wherein the stator, the rotor, and the motor control unit are incorporated together.

12. A brushless motor comprising:
a stator provided with a winding;
a rotor disposed rotatably and confronting the stator; and
the motor control unit of claim 5,
wherein the stator, the rotor, and the motor control unit are incorporated together.

13. A brushless motor comprising:
a stator provided with a winding;
a rotor disposed rotatably and confronting the stator; and
the motor control unit of claim 6,
wherein the stator, the rotor, and the motor control unit are incorporated together.

14. A brushless motor comprising:
a stator provided with a winding;
a rotor disposed rotatably and confronting the stator; and
the motor control unit of claim 7,
wherein the stator, the rotor, and the motor control unit are incorporated together.

* * * * *